United States Patent
Bogner et al.

(10) Patent No.: US 8,970,408 B2
(45) Date of Patent: Mar. 3, 2015

(54) BUILT-IN-SELF-TEST FOR AN ANALOG-TO-DIGITAL CONVERTER

(71) Applicant: Infineon Technologies AG, Neubiberg (DE)

(72) Inventors: Peter Bogner, Wernberg (AT); Jaafar Mejri, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/934,554

(22) Filed: Jul. 3, 2013

(65) Prior Publication Data

US 2015/0009052 A1 Jan. 8, 2015

(51) Int. Cl.
*H03M 1/06* (2006.01)
*H03M 1/10* (2006.01)
*G01R 31/28* (2006.01)

(52) U.S. Cl.
CPC ......... *H03M 1/1071* (2013.01); *G01R 31/2884* (2013.01)
USPC .......................................... 341/118; 341/155

(58) Field of Classification Search
CPC ......... H03M 3/46; H03M 3/458; H03M 3/43; H03M 3/454; H03M 1/38; H03M 1/361
USPC ......... 341/144, 155, 143, 156, 163, 164, 161, 341/118, 120
See application file for complete search history.

(56) References Cited

U.S. PATENT DOCUMENTS

| | | | | |
|---|---|---|---|---|
| 5,341,135 A | * | 8/1994 | Pearce | 341/120 |
| 5,982,313 A | * | 11/1999 | Brooks et al. | 341/143 |
| 6,970,118 B2 | * | 11/2005 | Regier | 341/118 |
| 7,129,874 B2 | * | 10/2006 | Bjornsen | 341/143 |
| 7,511,648 B2 | * | 3/2009 | Trifonov et al. | 341/143 |
| 7,944,386 B2 | * | 5/2011 | Hurrell et al. | 341/155 |
| 8,094,051 B2 | * | 1/2012 | Bos et al. | 341/143 |

* cited by examiner

*Primary Examiner* — Peguy Jean Pierre
(74) *Attorney, Agent, or Firm* — Schiff Hardin LLP

(57) ABSTRACT

A semiconductor chip with a built-in-self-test circuit including a first analog-to-digital converter (ADC) configured to convert an analog input voltage signal received at its input into a digital output voltage signal that characterizes the first ADC; and a second ADC coupled to the input of the first ADC and configured to convert the analog input voltage signal received at its input to a digital feedback voltage signal, wherein the analog input voltage signal is generated based on the digital feedback signal.

20 Claims, 3 Drawing Sheets

US 8,970,408 B2

BUILT-IN-SELF-TEST FOR AN ANALOG-TO-DIGITAL CONVERTER

BACKGROUND

An Analog-to-Digital Converter (ADC) is a common component in many semiconductor devices. An ADC operates by receiving an analog input voltage signal and converting this voltage signal into a digital voltage signal representation. Many different types of ADCs are available.

Microcontrollers have multiple ADCs embedded on the same semiconductor chip. These embedded ADCs have been tested during production by measuring characteristic curves in a manner involving lengthy measurements due to characteristic conversion curves being sampled several times and the high precision ADCs having long settling times. Also, ADCs having high precision require expensive, high precision Automatic Test Equipment (ATE) hardware with a large number of signals being routed between the ATE hardware and the semiconductor chip. Each of these factors has a negative impact on production cost.

Alternatively, ADCs have been tested during production using a servo loop to measure the ADC characteristic conversion curves. Measurement times remain approximately constant, and complexity is reduced as a voltage generator is replaced with a voltage measurement instrument. This servo loop technique is still limited, however, as the signals from the semiconductor chip still have to be routed to the voltage measurement instrument.

DETAILED DESCRIPTION

The present disclosure is directed to a semiconductor chip having a Built-In-Self-Test (BIST) circuit, and more specifically, to a semiconductor chip having a BIST circuit for an Analog-to-Digital Converter (ADC) using a second ADC located on the same semiconductor chip.

One electronic device that may use this BIST circuit is a microcontroller. The BIST circuit described herein is in no way intended to be limited for use in a microcontroller, rather, the BIST circuit is capable of being used with any electronic device that employs an ADC.

Figure 1:
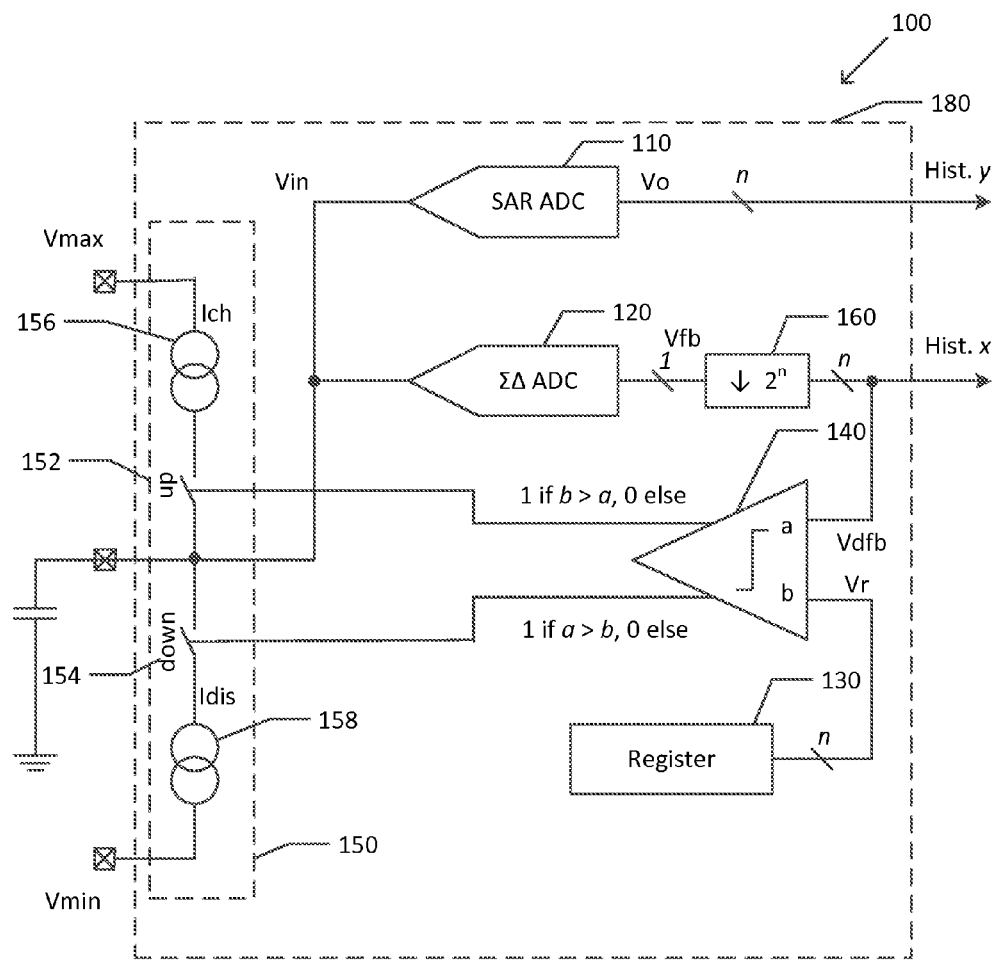
FIG. 1 illustrates a circuit diagram of a built-in-self-test (BIST) circuit in accordance with an exemplary embodiment.

FIG. 1 illustrates a circuit diagram 100 of a BIST circuit in accordance with an exemplary embodiment. More specifically, BIST circuit 180 comprises a Sigma-Delta (ΣΔ) ADC 120 which generates, along with additional components in a feedback loop, an analog input voltage Vin which is then used as an analog input voltage Vin to Successive Approximation Register (SAR) ADC 110. With the analog input voltage Vin being generated on-chip, a BIST for the SAR ADC 110 is possible.

This BIST of SAR ADC 110 is particularly feasible if there is another ADC, in this case ΣΔ ADC 120, already located within the same semiconductor chip 100. It is noted that SAR ADC 110 and ΣΔ ADC 120 can be used independently during normal operation. On the other hand, if there is no other ADC available within the semiconductor chip 100, ΣΔ ADC 120 could be implemented to be dedicated for BIST purposes. For economic reasons the additional area for this dedicated ΣΔ ADC should be minimal.

A goal is to add only minimal additional components. In the implementation shown in FIG. 1, a push-pull current source 150 including two current sources 156, 158 and two switches 152, 154, is implemented to support the BIST.

During operation, ΣΔ ADC 120 is in a feedback loop with digital comparator 140 which drives push/pull current source 150 to generate analog input voltage Vin. A more detailed description follows.

ΣΔ ADC 120, which is shown in FIG. 1 as a 1-bit ΣΔ ADC but not limited thereto, converts analog input voltage signal Vin received at its input to a 1-bit digital feedback voltage signal Vfb. Then, in order to reduce the data rate, decimator 160 downsamples, that is sums for $2^n$ clock cycles, the digital feedback voltage signal Vfb into an n-bit decimated digital feedback voltage signal Vdfb.

Digital comparator 140, which has high amplification, is provided to compare the decimated digital feedback voltage signal Vdfb received at its input "a" with an n-bit digital register voltage signal Vr received from register 130 at its input "b". Digital register 130 may be a counter, CPU, memory or, as should be appreciated to those skilled in the art, any other element suitable for supplying a desired digital register voltage signal Vr, which will be reflected in analog form as the analog input voltage signal Vin. For example, digital register 130 may be a counter configured to generate a digital voltage ramp, which will be reflected in analog form as analog input voltage signal Vin.

When the value of digital register voltage signal Vr is greater than the value of decimated feedback voltage signal Vdfb, comparator output "a" assumes a logical "1" to place up switch 152 in a closed position, and comparator output "b" assumes a logical "0" to place down switch 154 in an open position. Charging current source Ich 156 in this circuit configuration is coupled to the inputs of SAR ADC 110 and ΣΔ ADC 120, and the value of analog input voltage signal Vin thereby increases. On the other hand, when the value of decimated feedback voltage signal Vdfb is greater than the value of digital register voltage signal Vr, comparator output "a" assumes a logical "0" to place up switch 152 in an open position, and comparator output "b" assumes a logical "1" to place down switch 154 in an closed position. Discharging current source Idis 158 in this configuration is coupled to the inputs of SAR ADC 110 and ΣΔ ADC 120, and the value of analog input voltage signal Vin thereby decreases. As should be apparent, when the values of decimated feedback voltage signal Vdfb and digital register voltage signal Vr are equal, both up switch 152 and down switch 154 are open, and the analog input voltage Vin remains stable.

The push/pull current source 150 is coupled between voltages Vmax and Vmin. Vmax's value is higher than that of the power supply, and Vmin's value is lower than that of ground, so that the generated analog input voltage Vin extends over the entire power supply range. Also, an input capacitor, which is coupled to the node between switches 152 and 154 and ground, functions to reduce ripple in the analog input voltage Vin. Voltages Vmax, Vmin and the decoupling capacitor are provided from circuitry external to the microcontroller.

The generated analog input voltage Vin is used as an input voltage signal to SAR ADC 110, which is the ADC being tested. SAR ADC 110 converts the analog input voltage Vin to a digital output voltage Vo. The outputs of SAR ADC 110 and ΣΔ ADC 120, shown in FIG. 1 as Histy and Histx, respectively, can be processed by firmware within the microcontroller or evaluated by ATE hardware to determine the characteristics of SAR ADC 110. In the case of the register voltage signal Vr being a ramp, by way of example, the resulting histogram for a properly functioning SAR ADC 110 is a flat line. Alternatively, in the case of register voltage signal Vr being a sine wave, the resulting histogram for a properly functioning SAR ADC 110 has a shape similar to a bathtub. The digital output voltage Vo thus characterizes the SAR ADC 110.

ADC 110 is shown in FIG. 1 as an SAR ADC, and ADC 120 is shown as a $\Sigma\Delta$ ADC. Such SAR ADCs and $\Sigma\Delta$ ADCs are known to those skilled in the art and will not be discussed in more detail here in order to not unnecessarily obscure aspects of the disclosure. It is important to note, however, that while ADC 110 is described as being an SAR ADC and ADC 120 is described as being a $\Sigma\Delta$ ADC, the disclosure in not limited in these respects. Each of ADC 110 and ADC 120 may be any kind of ADC suitable for their intended purposes.

Figure 2:
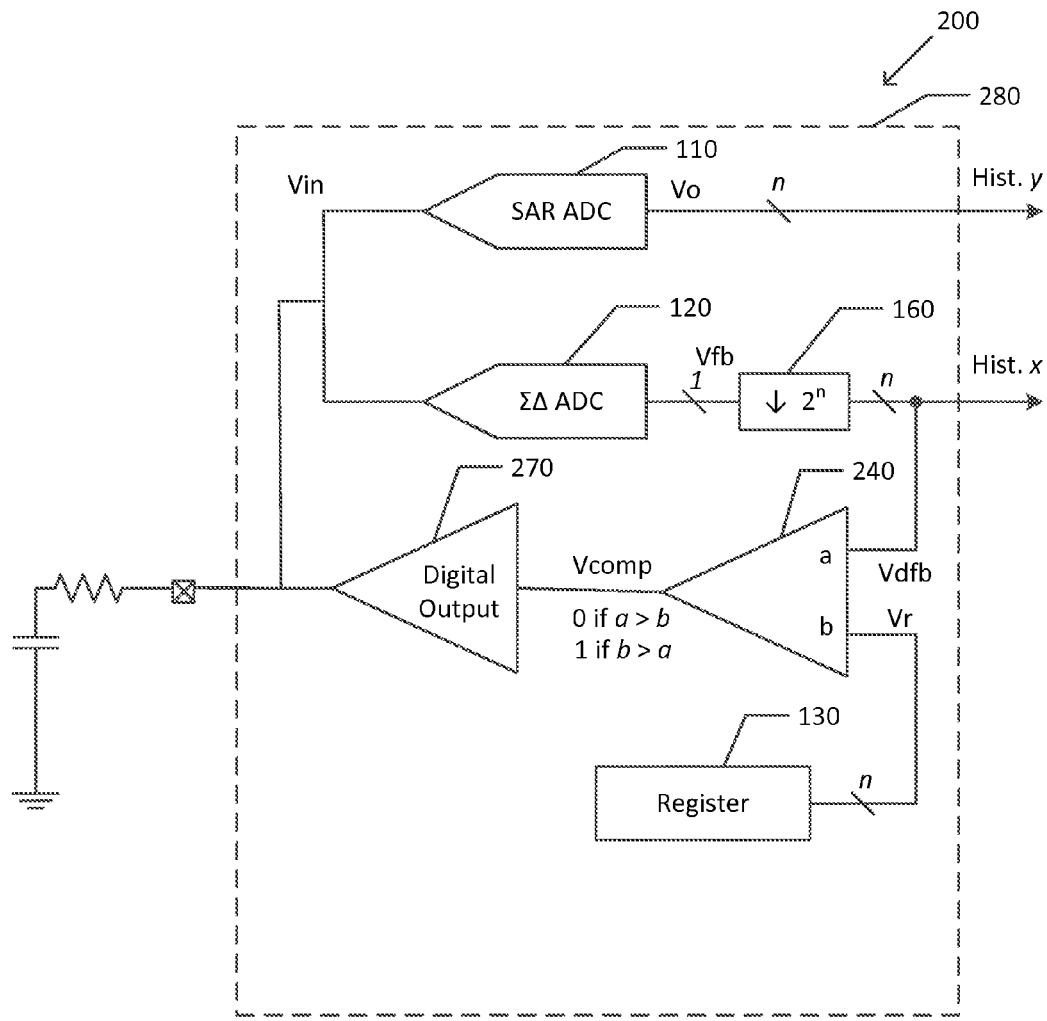
FIG. 2 illustrates a circuit diagram of a BIST circuit in accordance with another exemplary embodiment.

FIG. 2 illustrates a circuit diagram 200 of a BIST circuit 280 in accordance with another exemplary embodiment. This embodiment has substantially the same purpose as the embodiment shown in FIG. 1. Namely, this alternative BIST circuit 280 comprises a $\Sigma\Delta$ ADC 120 which generates, along with additional components in a feedback loop, an analog input voltage Vin which is then used as an analog input voltage Vin to SAR ADC 110.

A main difference of this alternative embodiment is that push-pull current source 150 is replaced by digital output 270 in a push/pull configuration. Digital output 270 is driven by comparison voltage Vcomp from comparator 240. An RC low pass filter, formed of a capacitor and a resistor, functions to cut ripple between voltages. This alternative configuration avoids a need for the current sources of FIG. 1, but it does have 0 dB power supply rejection ratio, which might be acceptable during BIST setup. Other elements being the same as those described in connection with FIG. 1 are denoted with the same reference numerals and, for the sake of brevity, their descriptions are not repeated.

Figure 3:
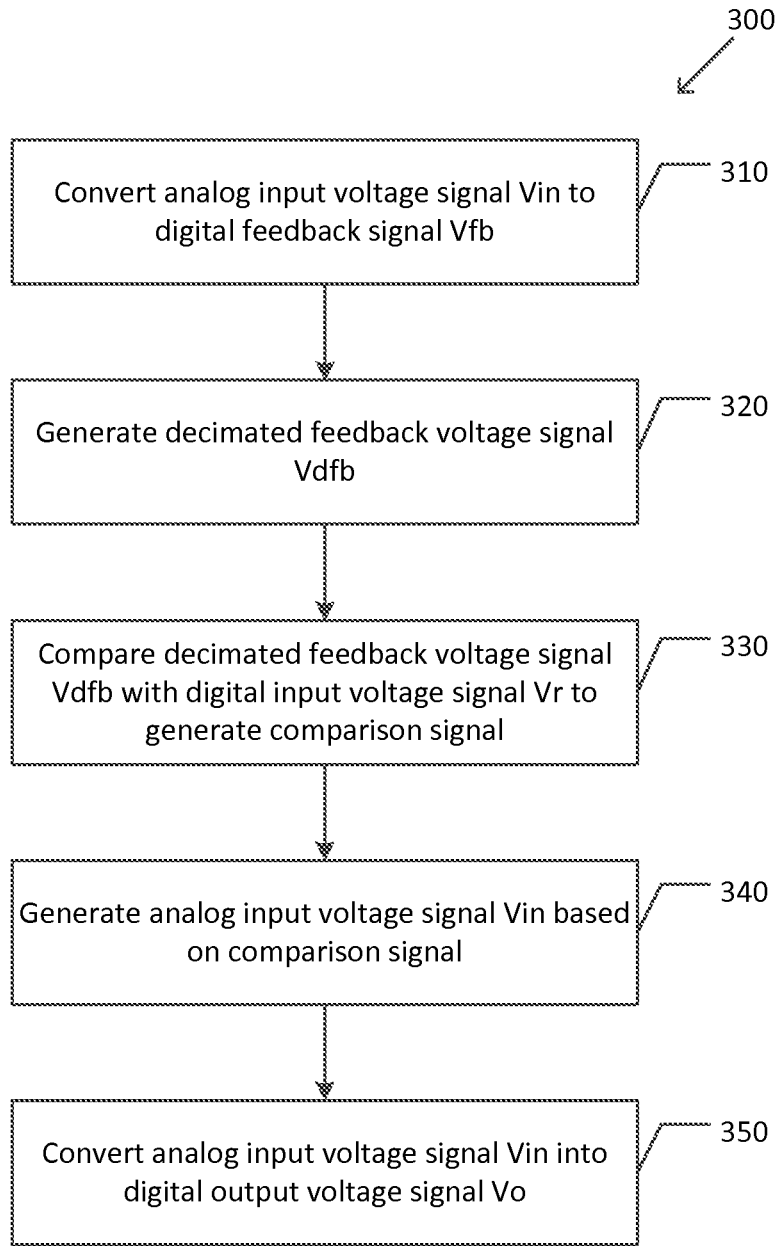
FIG. 3 illustrates a flowchart for a method of performing a BIST in accordance with an exemplary embodiment.

FIG. 3 illustrates a flowchart for a method 300 of performing a BIST in accordance with an exemplary embodiment.

Initially, in Step 310, $\Sigma\Delta$ ADC 120 converts analog input voltage signal Vin received at its input to a digital feedback voltage signal Vfb. Decimator 160 then generates a decimated digital feedback voltage signal Vdfb of the digital feedback voltage signal Vfb received from the $\Sigma\Delta$ ADC 120 at Step 320.

At step 330, comparator 140/240 compares the decimated digital feedback voltage signal Vdfb with a digital input voltage signal Vr from register 130 and outputs a comparison signal. This comparison signal is then used to generate the analog input voltage signal Vin, at Step 340. As discussed above, the analog input voltage signal Vin may be generated based on the comparison signal using a push-pull current source 150, as shown in FIG. 1, or alternatively, using a digital output pad 270, as shown in FIG. 2.

Finally, SAR ADC 110, which is the device under test, converts the analog input voltage signal Vin received at its input into a digital output voltage signal Vo that characterizes the SAR ADC 110 (step 350).

The BIST implementation disclosed herein is advantageous in many other aspects. First, the analog input voltage Vin is precise enough to test an ADC, and can also be used for other test purposes not related to an ADC. Despite the precision of the analog input voltage Vin, test time is still reduced as compared with conventional test implementations.

Further, the analog input voltage Vin is generated internally within a microcontroller or other application. After the ADC generating the analog input voltage Vin has been proven to be functional, any other ADC within the microcontroller can be tested internally without a need for ATE hardware. The ATE hardware instead can be used for other purposes, thus increasing potential for parallel testing. Further, the test board design requires fewer connections necessary, which is significant especially for tests with a high parallelization factor.

Finally, all signals needed for the BIST lie within the digital domain. This factor, coupled with the tests being conducted internally, means that testing can be conducted not only during production, but after packaging, such as before shipment or in the field. The measurement data can therefore be available to customers for system health monitoring purposes or to increase the safety integration level.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Additionally, in the detailed description, numerous specific details have been set forth in order to provide a thorough understanding of the exemplary embodiments. However, it should be apparent to one of ordinary skill in the art that the embodiments may be practiced without these specific details. In other instances, well-known methods, procedures, components, and circuits have not been described in detail so as not to unnecessarily obscure aspects of the disclosure.

What is claimed is:

1. A semiconductor chip with a built-in-self-test circuit, comprising:
   a first analog-to-digital converter (ADC) configured to convert an analog input voltage signal received at its input into a digital output voltage signal that characterizes the first ADC; and
   a second ADC coupled to the input of the first ADC and configured to convert the analog input voltage signal received at its input to a digital feedback voltage signal,
   wherein the analog input voltage signal is generated based on the digital feedback signal.

2. The semiconductor chip of claim 1, further comprising:
   a comparator coupled to the second ADC and configured to compare the digital feedback voltage signal received at its first input from the second ADC with a digital input voltage signal received at its second input, and to output a comparison signal,
   wherein the analog input voltage signal is generated based on the comparison signal.

3. The semiconductor chip of claim 2, wherein the second ADC is a single-bit delta sigma ADC.

4. The semiconductor chip of claim 3, further comprising:
   a decimator coupled between the second ADC and the first input of the comparator and configured to generate a decimated digital feedback voltage signal.

5. The semiconductor chip of claim 2, further comprising:
   a push-pull current source coupled between the output of the comparator and the inputs of each of the first ADC and the second ADC, and configured to generate the analog input voltage signal based on the comparison signal.

6. The semiconductor chip of claim 2, further comprising:
   a counter configured to generate a voltage ramp as the digital input voltage signal.

7. The semiconductor chip of claim 2, further comprising:
   a register configured to provide a sine wave signal as the digital input voltage signal.

8. The semiconductor chip of claim 2, further comprising:
   a digital output pad in a push-pull configuration coupled between the output of the comparator and the inputs of each of the first ADC and the second ADC, and configured to generate the analog input voltage signal based on the comparison signal.

9. The semiconductor chip of claim 1, wherein the first ADC is a successive approximation register (SAR) ADC.

10. The semiconductor chip of claim 1, wherein the second ADC is a sigma delta ADC.

11. The semiconductor chip of claim 1, wherein the first ADC and the second ADC are located within a micro controller.

12. A method of performing a built-in-self-test (BIST) in a semiconductor chip, the method comprising:
converting an analog input voltage signal received at an input of a first analog-to-digital converter (ADC) located on the semiconductor chip into a digital output voltage signal that characterizes the first ADC; and
converting the analog input voltage signal received at an input of a second ADC, which is coupled to the input of the first ADC and located on the semiconductor chip, to a digital feedback voltage signal,
wherein the analog input voltage signal is generated based on the digital feedback signal.

13. The method of claim 12, further comprising:
comparing the digital feedback voltage signal received from the second ADC at a first input of a comparator with a digital input voltage signal received at a second input of the comparator, and outputting a comparison signal,
wherein the analog input voltage signal is generated based on the comparison signal.

14. The method of claim 13, further comprising:
generating, by a decimator, a decimated digital feedback voltage signal of the digital feedback voltage signal received from the second ADC to be input to the first input of the comparator.

15. The method of claim 13, further comprising:
generating, by a push-pull current source coupled between the output of the comparator and the inputs of each of the first ADC and the second ADC, the analog input voltage signal based on the comparison signal.

16. The method of claim 13, further comprising:
generating a voltage ramp as the digital input voltage signal.

17. The method of claim 12, performed during production of the semiconductor chip.

18. The method of claim 12, performed after the semiconductor chip is packaged.

19. The method of claim 12, performed within a microcontroller.

20. A semiconductor chip with a built-in-self-test circuit, comprising:
a first analog-to-digital converting means for converting an analog input voltage signal into a digital output voltage signal that characterizes the first analog-to-digital converting means; and
a second analog-to-digital converting means for converting the analog input voltage signal to a digital feedback voltage signal,
wherein the analog input voltage signal is generated based on the digital feedback signal.

* * * * *